United States Patent
Ross et al.

(10) Patent No.: US 6,223,319 B1
(45) Date of Patent: Apr. 24, 2001

(54) TURBO CODE DECODER WITH CONTROLLED PROBABILITY ESTIMATE FEEDBACK

(75) Inventors: John Anderson Fergus Ross, Schenectady; Stephen Michael Hladik, Albany; Nick Andrew Van Stralen, Schenectady; John Bailey Anderson, Latham, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/137,257

(22) Filed: Aug. 20, 1998

(51) Int. Cl.[7] .................................................. G06F 11/10
(52) U.S. Cl. ........................................... 714/755; 714/786
(58) Field of Search ..................................... 714/755, 756, 714/746, 786

(56) References Cited

U.S. PATENT DOCUMENTS

| | | |
|---|---|---|
| 5,406,570 | 4/1995 | Berrou et al. . |
| 5,446,747 | 8/1995 | Berrou . |
| 5,465,321 * | 11/1995 | Smyth .................................. 706/20 |
| 5,721,745 | 2/1998 | Hladik et al. . |
| 5,721,746 | 2/1998 | Hladik et al. . |
| 5,734,962 | 3/1998 | Hladik et al. . |
| 5,893,058 * | 4/1999 | Kosaka .................................. 704/254 |

OTHER PUBLICATIONS

"Illuminating the Structure of Code and Decoder of Parallel Concatenated Recursive Systematic (Turbo) Codes," Patrick Robertson, IEEE, 1994, pp. 1298–1303.

"Optimal Decoding of Linear Codes for Minimizing Symbol Error Rate," LR Bahl, J Cocke, F. Jelinek; J. Raviv, IEEE Transactions on Information Theory, Mar. 1974, pp. 284–287.

"Near Shannon Limit Error–Correcting Coding and Deconding: Turbo–Codes (1)," Claude Berrou, Alain Glavieux; Punya Thitimajshima, IEEE, 1993, pp. 1064–1070.

* cited by examiner

*Primary Examiner*—Phung M. Chung
(74) *Attorney, Agent, or Firm*—Jill M. Breedlove; Douglas E. Stoner (57) ABSTRACT

A feedback control for a turbo decoder controls the feedback between component decoders by modifying updated a priori probabilities calculated by one component decoder and used as inputs to another component decoder during the decoding process, resulting in a significant performance advantage. A feedback control switch selects either previously estimated a posteriori probabilities, modifications of these values, or neutral values as a priori probabilities utilized by the next component decoder.

17 Claims, 5 Drawing Sheets fig. 1 fig. 2 fig. 3 fig. 4 fig. 5

TURBO CODE DECODER WITH CONTROLLED PROBABILITY ESTIMATE FEEDBACK

BACKGROUND OF THE INVENTION

The present invention relates generally to error-correction coding and, more particularly, to parallel concatenated convolutional coding, i.e., turbo coding.

A new class of forward error control codes, referred to as turbo codes, offers significant coding gain for power limited communication channels. Turbo codes are generated by using two recursive systematic encoders operating on different orderings of the same information bits. A subset of the code bits of each encoder is transmitted to maintain bandwidth efficiency. Turbo decoding involves an iterative algorithm in which probability estimates of the information bits that are derived for one of the codes are fed back to a probability estimator for the other code. Each iteration of processing generally increases the reliability of the probability estimates. This process continues, alternately decoding the two code words until the probability estimates can be used to make reliable decisions.

The maximum a posteriori (MAP) type algorithm introduced by Bahl, Cocke, Jelinek, and Raviv in "Optimal Decoding of Linear Codes for Minimizing Symbol Error Rate", *IEEE Transactions on Information Theory*, March 1974, pp. 284–287, is particularly useful as a component decoder in decoding parallel concatenated convolutional codes, i.e., turbo codes. The MAP algorithm is used in the turbo decoder to generate a posteriori probability estimates of the systematic bits in the code word. These probability estimates are used as a priori symbol probabilities for the second MAP decoder. Three fundamental terms in the MAP algorithm are: forward and backward state probability functions (the alpha and beta functions, respectively) and the a posteriori transition probabilities (the sigma function).

Various probability estimates comprise inputs at several points in a MAP decoding algorithm. It is desirable to modify or restrict these probability inputs in a MAP decoding algorithm in order to improve decoding performance, such as, for example, decrease the probability of error in the decoded bits.

SUMMARY OF THE INVENTION

A feedback control for a turbo decoder controls the feedback between component decoders of the turbo decoder by updated a priori probabilities calculated by one component decoder and used as inputs to another component decoder during the decoding process, resulting in a performance advantage. A feedback control switch selects either previously estimated a posteriori probabilities, modifications of these values, or neutral values as a priori probabilities utilized by the next component decoder. In one embodiment, unmodified, or standard, a posteriori probabilities from a prior decoding iteration of a component code word are inputted as a priori information is used in the alpha and beta calculations for all decoding iterations, but neutral values are switched in for all sigma calculations except for the final iteration for which the feedback control switch reverts back to full a priori information.

DETAILED DESCRIPTION OF THE INVENTION

Summary of the MAP Decoding Algorithm

The maximum a posteriori (MAP) algorithm for decoding linear codes was published by Bahl, Cocke, Jelinek, and Raviv, as cited hereinabove. Basically, this algorithm calculates the a posteriori probability of each state in a trellis corresponding to a received code word conditioned on the entire received code word. A variation of this algorithm calculates the a posteriori probability of each state transition in a trellis corresponding to a received code word conditioned on the received channel information. Since this variation is of particular interest when decoding recursive systematic convolutional codes, which are typically utilized in turbo coding, the description of the invention will be built around this form of the algorithm. However, the invention also applies to the version of the MAP algorithm that calculates a posteriori state probabilities in a straightforward manner.

Figure 1:
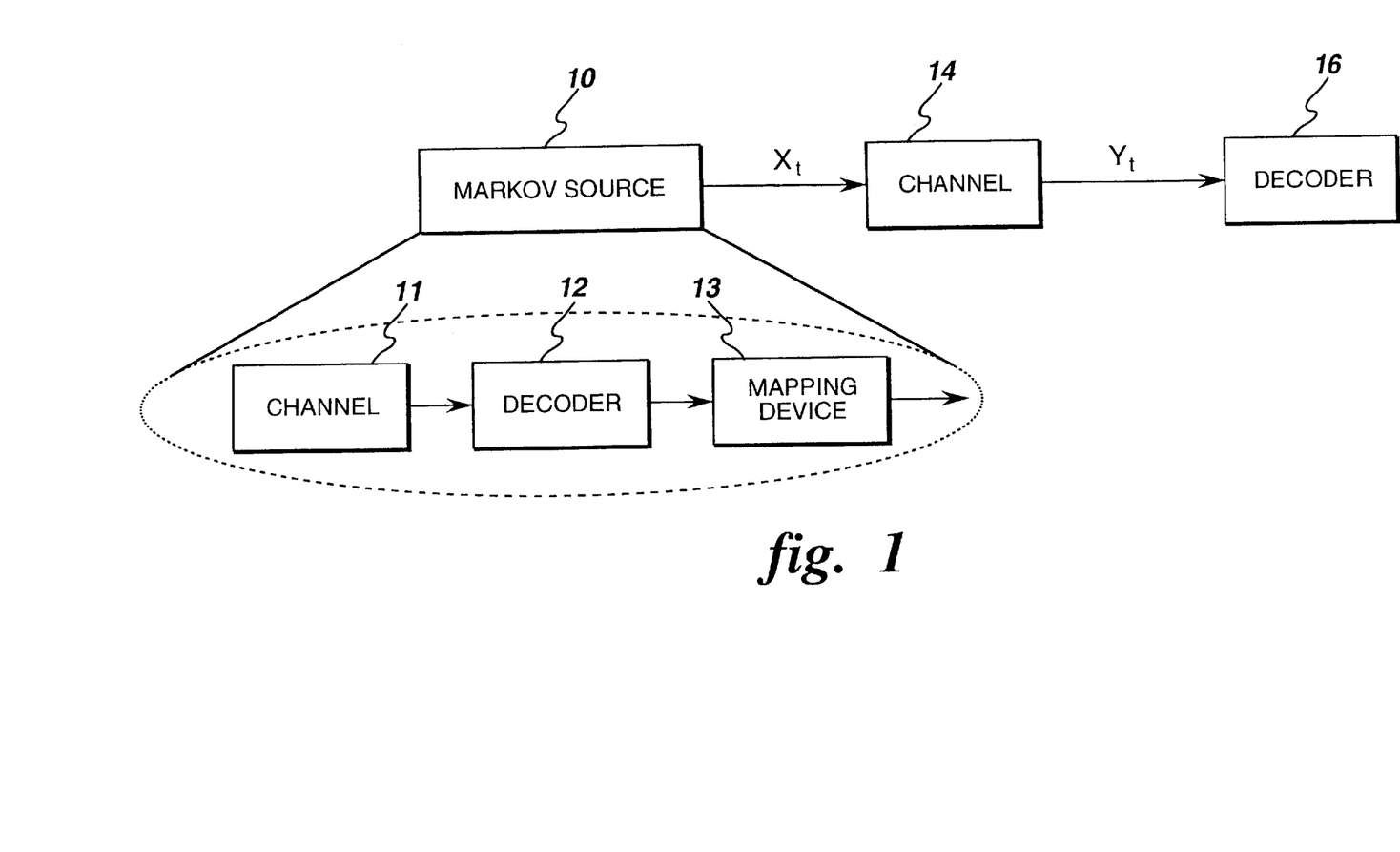
FIG. 1 is a block diagram of a simple communications system comprising a Markov source, a memoryless channel and decoder.

Consider the simple communication system block diagram of FIG. 1 for the purpose of describing the MAP algorithm. The source 10 is a discrete-time, finite-state Markov process, shown as comprising a source 11, an encoder 12, and a mapping device 13. As shown, the source's output at time t is $X_t$ and the corresponding channel 14 output is $Y_t$, which is provided as the input to a decoder 16. The following definitions are also needed to describe the MAP algorithm. Let M=the number of distinct states of the Markov source;

m=the index of the Markov source's states $\{0,1,\ldots,M-1\}$;

$S_t$=state of the Markov source at time t;

$S_t^u=S_t, S_{t+1},\ldots S_u$, the state sequence of the Markov source from time t to time u;

$X_t^u=X_t, X_{t+1},\ldots X_u$, the output sequence of the Markov source from time t to time u;

$Y_t^u=Y_t, Y_{t+1},\ldots Y_u$, the output sequence of the channel from time t to time u, and L=the length of the source's output sequence.

Furthermore, it is assumed that the Markov source's initial state $S_O=0$ and its final state $S_L=0$.

The channel is noisy and memoryless so that a sequence of the source's output symbols $X_t^u$ is transformed into a sequence of channel outputs $Y_t^u$ according to the following channel transition probabilities.

$$Pr\{Y_t^u|X_t^u\}=Pr\{Y_t|X_t\}Pr\{Y_{t+1}|X_{t+1}\}\ldots Pr\{Y_u|X_u\} \qquad (1)$$

The decoder examines the received channel output sequence and estimates the a posteriori probabilities of the Markov source's states or state transitions. The state a posteriori probabilities $Pr\{S_t=m|Y_1^L\}$ can be written as $$Pr\{S_t=m|Y_1^L\}=Pr\{S_t=m; Y_1^L\}/Pr\{Y_1^L\} \qquad (2)$$

using the definition of conditional probability. Our notation is as follows: $Pr\{A|B\}$ means the conditional probability of event A given event B, and Pr{A;B} means the joint probability of events A and B. Similarly, the source's state transition a posteriori probabilities can be written as $$Pr\{S_{t-1}=m'; S_t=m|Y_1^L\}=Pr\{S_{t-1}=m'; S_t=m; Y_1^L\}/Pr\{Y_1^L\}. \quad (3)$$

It turns out that it is easier to derive an algorithm to calculate the joint probabilities on the right-hand sides of equations (2) and (3). The desired conditional probabilities can then be obtained by simply dividing these joint probabilities by the constant $Pr\{Y_1^L\}$. To clarify the derivation, Bahl et al. defined the following probability functions.

$$\alpha_t(m)=Pr\{S_t=m; Y_1^t\} \quad (4)$$

$$\beta_t(m)=Pr\{Y_{t+1}^L|S_t=m\} \quad (5)$$

$$\gamma_t(m',m)=Pr\{S_t=m; Y_t|S_{t-1}=m'\} \quad (6)$$

It can be shown that $$Pr\{S_t=m; Y_1^L\}=\alpha_t(m)\beta_t(m) \text{ and} \quad (7)$$

$$Pr\{S_{t-1}=m'; S_t=m; Y_1^L\}=\alpha_{t-1}(m')\gamma_t(m',m)\beta_t(m) \quad (8)$$

so all that remains is to calculate the values of $\alpha_t(m)$ $\gamma_t(m',m)$ and $\beta_t(m)$ for all values of m and t. It can be shown that for $t=1,2,\ldots,L$, $\alpha_t(m)$ can be calculated recursively as follows.

$$\alpha_t(m) = \sum_{m'=0}^{M-1} \alpha_{t-1}(m')\gamma_t(m', m) \quad (9)$$

For t=0, the boundary conditions are $\alpha_0(0)=1$ and $\alpha_0(m)=0$ for all $m\neq 0$. Similarly, $\beta_t(m)$ can be calculated recursively for $t=1,2,\ldots,L-1$.

$$\beta_t(m) = \sum_{m'=0}^{M-1} \beta_{t+1}(m')\gamma_{t+1}(m, m') \quad (10)$$

For t=L, the boundary conditions are $\beta_L(0)=1$ and $\beta_L(m)=0$ for all $m\neq 0$. In the calculation of $\gamma_t$, this quantity may be expanded as $$\gamma_t(m, m') = \sum_X Pr\{S_t = m | S_{t-1} = m'\}Pr\{X_t = X | S_t = m; S_{t-1} = m'\}Pr\{Y_t | X\} \quad (11)$$

For the cases of interest to us, the source's mapping of state transitions to output symbols is deterministic; i.e. there is only one possible output symbol X for each state transition, so that $Pr\{X_t|S_t=m; S_{t-1}=m'\}=1$ and $\gamma_t(m',m)$ can be written as $$\gamma_t(m',m)=Pr\{S_t=m|S_{t-1}=m'\}Pr\{Y_t|X\}. \quad (12)$$

The calculation of $Pr\{S_{t-1}=m'; S_t=m; Y_1^L\}$ using the algorithm of Bahl et al. can be summarized as follows.
1. $\alpha_0(0)=1$ and $\alpha_0(m)=0$ for all $m\neq 0$. $\beta_L(0)=1$ and $\beta_L(m)=0$ for all $m\neq 0$.
2. As soon as $Y_t$ is received, the decoder computes $\gamma_t(m',m)$ using equation (12) and $\alpha_t(m)$ using equation (9). The calculated values of $\alpha_t(m)$ are stored for all t and m. The calculated values of $\gamma_t(m',m)$ are stored for all t and all transitions (m',m) or calculated as needed.
3. After the complete sequence of channel outputs $Y_1^L$ is received, the decoder recursively computes $\beta_t(m)$ using equation (10). When all of the $\beta_t(m)$ have been computed, they can be multiplied by the appropriate $\alpha_{t-1}(m')$ and $\gamma_t(m',m)$ to obtain $Pr\{S_{t-1}=m'; S_t=m; Y_1^L\}$ as in equation (8).

When decoding trellis codes, the Markov source of FIG. 1 can be modeled as comprising a source of information bits, an encoder for the error correcting trellis code, and a mapping device that converts the encoder's output into symbols $X_t$, which are transmitted over the channel.

The term $Pr\{S_t=m|S_{t-1}=m'\}$, the encoder's conditional state probability, in equation (12) is calculated as $$Pr\{S_t = m | S_{t-1} = m'\} = \prod_{i=(t-1)k+1}^{tk} Pr\{d_i = a_i(m', m)\} \quad (13)$$

for an (n,k,v) code where $Pr\{d_i=a_i(m', m)\}$ is the a priori probability that $d_i=a_i(m',m)$ and $a_i(m',m)$ is the $i^{th}$ bit of the sequence a(m',m) of k bits that drives the encoder from state m' to state m. This equation holds when the code's trellis does not have parallel branches. (If the code's trellis does have parallel branches, then $Pr\{S_t=m|S_{t-1}=m'\}$ is calculated as the sum of products of bit a priori probabilities in which the sum is over all of the sequences of source bits a(m',m) that drive the encoder from state m' to state m.)

In the decoder, we are interested in event likelihood ratios; specifically, we are interested in $Pr\{d_\tau=1|Y_1^L\}/Pr\{d_\tau=0|Y_1^L\}$, where $Pr\{d_\tau=i|Y_1^L\}$ represents the a posteriori probability that data bit $d_\tau$ from the source is equal to i $\in \{0,1\}$. Here, $$Pr\{d_\tau = 0 | Y_1^L\} = \sum_{(m',m)\in A_t(\tau)} Pr\{S_{t-1} = m'; S_t = m | Y_1^L\} \quad (14)$$

$$= \frac{\sum_{(m',m)\in A_t(\tau)} Pr\{S_{t-1} = m'; S_t = m; Y_1^L\}}{Pr\{Y_1^L\}}$$

In the equation above $A_t(\tau)$ is the set of all state transitions (m',m) in the encoder which terminate at time t due to an information bit $d_\tau=0$. Recall that in general there are k source bits encoded into each n-bit encoder output symbol so that $d_\tau$ for indices $\tau=(t-1)k+1, (t-1)k+2, \ldots, tk$ are associated with the state transition $S_{t-1}$ to $S_t$. Also, $$Pr\{d_\tau = 1 | Y_1^L\} = \sum_{(m',m)\in B_t(\tau)} Pr\{S_{t-1} = m'; S_t = m | Y_1^L\} \quad (15)$$

$$= \frac{\sum_{(m',m)\in B_t(\tau)} Pr\{S_{t-1} = m'; S_t = m; Y_1^L\}}{Pr\{Y_1^L\}}$$

In the equation above $B_t(\tau)$ is the set of all state transitions (m',m) in the encoder which terminate at trellis level t due to an information bit $d_\tau=1$. Since we are working with the likelihood ratio $Pr\{d_\tau=1|Y_1^L\}/Pr\{d_\tau=0|Y_1^L\}$, it is not necessary to calculate $Pr\{S_{t-1}=m'; S_t=m|Y_1^L\}$; we may use $Pr\{S_{t-1}=m'; S_t=m; Y_1^L\}$ directly since $Pr\{Y_1^L\}$ is common to the numerator and denominator. Therefore, the desired likelihood ratio from the decoder is $$\lambda(d_\tau) = \frac{Pr\{d_\tau = 1 | Y_1^L\}}{Pr\{d_\tau = 0 | Y_1^L\}} \quad (16)$$

-continued $$= \frac{\sum_{(m',m)\in B_t(\tau)} Pr\{S_{t-1} = m'; S_t = m; Y_1^L\}}{\sum_{(m',m)\in A_t(\tau)} Pr\{S_{t-1} = m'; S_t = m; Y_1^L\}}.$$

Since the joint probability $Pr\{S_{t-1}=m'; S_t=m; Y_1^L\}$ is used often herein, the following notation from Bahl et al. is introduced for brevity.

$$\sigma_t(m', m) = Pr\{S_{t-1} = m'; S_t = m; Y_1^L\} = \alpha_{t-1}(m')\gamma_t(m', m)\beta_t(m) \quad (17)$$

When the encoder's input symbols are binary, i.e. k=1, equations (13) through (16) can be simplified since τ=t in this case. The simplified equations are presented below.

$$Pr\{S_t=m|S_{t-1}=m'\}=P\{d_t=a(m',m)\}, \text{ where} \quad (18)$$

a(m',m)=the bit value that drives the encoder from state m' to state m.

$$Pr\{d_t = 1 \mid Y_1^L\} = \sum_{(m',m)\in A_t} Pr\{S_{t-1} = m'; S_t = m \mid Y_1^L\} \quad (19)$$

$$= \frac{\sum_{(m',m)\in A_t} Pr\{S_{t-1} = m'; S_t = m; Y_1^L\}}{Pr\{Y_1^L\}}$$

$$= \frac{\sum_{(m',m)\in A_t} \sigma_t(m', m)}{Pr\{Y_1^L\}},$$

where $A_t$=the set of all state transitions (m',m) which terminate at level t in the encoder due to an information bit $d_t=0$.

$$Pr\{d_t = 1 \mid Y_1^L\} = \sum_{(m',m)\in A_t} Pr\{S_{t-1} = m'; S_t = m \mid Y_1^L\} \quad (20)$$

$$= \frac{\sum_{(m',m)\in A_t} Pr\{S_{t-1} = m'; S_t = m; Y_1^L\}}{Pr\{Y_1^L\}}$$

$$= \frac{\sum_{(m',m)\in A_t} \sigma_t(m', m)}{Pr\{Y_1^L\}},$$

where $B_t$=the set of all state transitions (m',m) which terminate at trellis level t in the encoder due to an information bit $d_t=1$.

$$\lambda(d_t) = \frac{Pr\{d_t = 1 \mid Y_1^L\}}{Pr\{d_t = 0 \mid Y_1^L\}} \quad (21)$$

$$= \frac{\sum_{(m',m)\in B_t} Pr\{S_{t-1} = m'; S_t = m; Y_1^L\}}{\sum_{(m',m)\in A_t} Pr\{S_{t-1} = m'; S_t = m; Y_1^L\}}$$

$$= \frac{\sum_{(m',m)\in B_t} \sigma_t(m', m)}{\sum_{(m',m)\in A_t} \sigma_t(m', m)}.$$

Description of the Log-MAP Decoder

The MAP decoder algorithm presented earlier requires a large number of multiplications. For some implementations wherein a large number of multiplications may be impractical, e.g., integrated circuit implementations, a logarithmic version of the MAP algorithm has been derived that eliminates all multiplication operations. The log-MAP algorithm primarily uses additions, table look-ups, and some simple logic functions. In an integrated circuit implementation of a decoder for trellis codes, the replacement of multiplications with additions enables large savings in gate count (die area) and significant increases in decoding speed. The following is a summary of the basic log-MAP algorithm.

Equations (7) through (10) become $$\ln Pr\{S_t = m; Y_1^L\} = \ln \alpha_t(m) + \ln \beta_t(m), \quad (22)$$

$$\ln Pr\{S_{t-1} = m'; S_t = m; Y_1^L\} = \ln \sigma_t(m', m) \quad (23)$$
$$= \ln \alpha_{t-1}(m') + \ln \gamma_t(m', m)$$
$$= \ln \beta_t(m'),$$

$$\ln \alpha_t(m) = \ln \sum_{m'=0}^{M-1} \exp(\ln \alpha_{t-1}(m') + \ln \gamma_t(m', m)), \text{ and} \quad (24)$$

$$\ln \beta_t(m) = \ln \sum_{m'=0}^{M-1} \exp(\ln \beta_{t+1}(m') + \ln \gamma_{t+1}(m, m')). \quad (25)$$

Equations (24) and (25) are derived from equations (9) and (10), respectively, by applying the identity $$a \cdot b = \exp(\ln[a \cdot b]) = \exp(\ln a + \ln b)$$

to the product terms. For example, equation (24) is derived as follows:

$$\ln \alpha_t(m) = \ln \sum_{m'=0}^{M-1} \alpha_{t-1}(m') \gamma_t(m', m)$$

$$= \ln \sum_{m'=0}^{M-1} \exp(\ln[\alpha_{t-1}(m') \gamma_t(m', m)])$$

$$= \ln \sum_{m'=0}^{M-1} \exp(\ln \alpha_{t-1}(m') + \ln \gamma_t(m', m)).$$

The boundary conditions are now $\ln \alpha_0(0)=0$ and $\ln \alpha_0(m)=-\infty$ for all m≠0. Similarly, $\ln \beta_L(0)=0$ and $\ln \beta_L(m)=-\infty$ for all m≠0. In a practical implementation, a large negative number is substituted for $-\infty$.

The sum of exponential terms can be computed by applying the following identity.

$$\ln[\exp(a)+\exp(b)]=\max(a,b)+\ln[1+\exp(-|a-b|)] \quad (26)$$

Computational complexity can be significantly reduced by storing a table of values for the function $\ln[1+\exp(-|a-b|)]$ and applying equation (26). Experimentation has shown that 8 or 16 values of this function provide sufficient resolution to prevent performance degradation.

Equation (12) becomes $$\ln \gamma_t(m',m)=\ln Pr\{S_t=m|S_{t-1}=m'\}+\ln Pr\{Y_t|X\}. \quad (27)$$

Preferred Embodiments of the Invention

Turbo codes involve a parallel concatenation of two or more systematic codes. Decoding turbo codes is an iterative operation such that the work in decoding one component code is used as a priori information for decoding another component code. Iterations proceed a finite number of times with the passing of information between decoders comprising feedback in the decoding process. In accordance with preferred embodiments of the present invention, this feedback is controlled to improve decoder performance, e.g., by decreasing the probability of error in the decoded bits.

As set forth hereinabove, some of the fundamental terms in a MAP decoding algorithm are forward and backward state probabilities, commonly known as the alpha and beta functions, and a posteriori state transition probabilities, commonly known as the sigma functions. Calculations of these probabilities (i.e., the alpha, beta and sigma functions) require symbol transition probabilities, i.e., the gamma functions. From Bahl, Cocke, Jelinek, and Raviv in "Optimal Decoding of Linear Codes for Minimizing Symbol Error Rate", cited hereinabove, $$\gamma_t(m', m) = \sum_{X_t} P_t(m \mid m') q_t(X \mid m', m) R(Y_t \mid X_t) \quad (28)$$

where t is the symbol index and $$R(Y_t \mid X_t) = \prod_{j=1}^{J} R(Y_{tj} \mid X_{tj}) \quad (29)$$

where J is the number of bits comprising an encoder output symbol, $X_{tj}$ is the $j^{th}$ bit of symbol $X_t$ and $Y_{tj}$ is the $j^{th}$ channel output for received symbol $Y_t$, assuming binary signaling.

In a recursive systematic code, a single transition (m', m) determines a specific channel symbol $X_t$ so that the summation in equation (28) is eliminated and the function $q_t(X_t|m',m)$ is identically equal to one. Also, for a (2, 1) code, the channel transition probabilities are computed as the product of two one-dimensional transition probabilities for the information and parity bits; that is, $$R(X_t|Y_t) = R(Y_{ti}|Xt_{ti}) R(Y_{tp}|X_{tp}). \quad (30)$$

Furthermore, in turbo decoding, the conditional state probabilities are determined by the a priori bit probabilities as follows:

$$P_t(m|m') = AP_t(0) \text{ if } X_{ti}|m,m'=0 \quad (31)$$

$$P_t(m|m') = AP_t(1) \text{ if } X_{ti}|m,m'=1 \quad (32)$$

so that $$\gamma_t(m',m) = AP(0) R(Y_i|0) R(Y_p|X_p) \text{ if } X_{ti}|m,m'=0 \quad (33)$$

and $$\gamma_t(m',m) = AP(1) R(Y_i|1) R(Y_p|X_p) \text{ if } X_{ti}|m,m'=1 \quad (34).$$

The time index has been omitted in equations (27) and (28) for brevity.

The output of a MAP component decoder is an a posteriori probability estimate of the systematic symbols, denoted herein as $APP_t(0)$ and $APP_t(1)$. These a posteriori estimates are used as the a priori probabilities $AP_t(0)$ and $AP_t(1)$ for decoding another component code. The probability estimates are initialized to $AP(0)=AP(1)=0.5$, or the equivalent neutral value if working with the logarithm based algorithm, after which the component decoders use the output APP's of the other component decoders as input AP's.

The gamma values from equation (28) are used in three calculations in the MAP algorithm, i.e., in the recursions that generate the alpha and beta state probabilities, and in the sigma calculations. The input AP's are modified in these calculations in order to control feedback and improve performance in accordance with preferred embodiments of the present invention.

Figure 2:
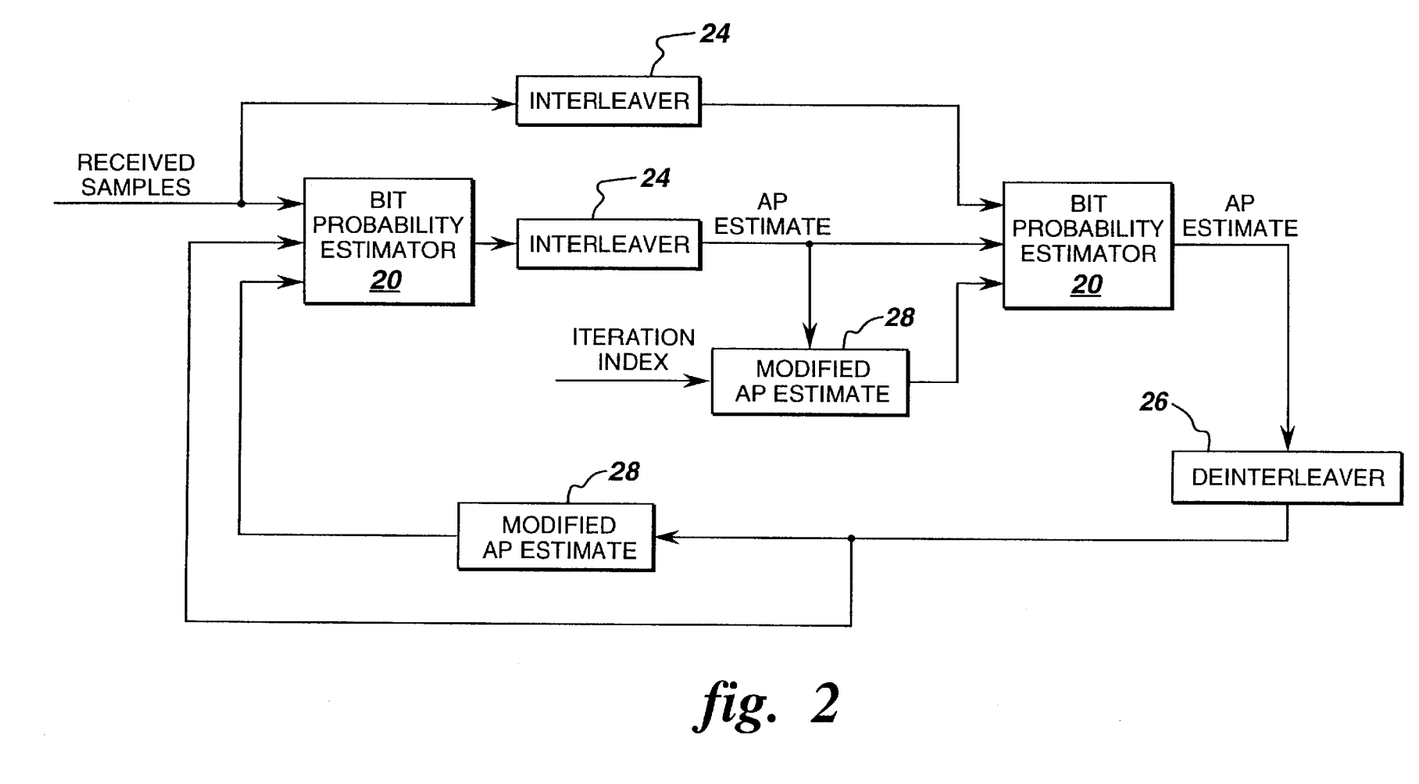
FIG. 2 is a block diagram of a turbo decoder in accordance with preferred embodiments of the present invention.

For a linear MAP algorithm, the AP values initially provided to the first decoder are $AP_t(0)=AP_t(1)=0.5$. The input to the next component decoder, and all subsequent MAP component decoders, comprises the latest available $APP_t$'s from the other decoders as input $AP_t$'s. This is illustrated in FIG. 2 wherein blocks 20 and 22 represent bit probability estimators for the first and second component decoders, respectively. Associated turbo decoder interleavers and deinterleavers are represented by the numerals 24 and 26, respectively. The input AP's are only used to calculate the gamma values required in the alpha and beta recursions. In a preferred embodiment of this invention, the gamma values, which are utilized in the sigma calculations, are calculated using $AP_t(0)=AP_t(1)=0.5$ for all t. In general, feedback control switches within the bit probability estimator select either the previously estimated AP value, a modification of the previously estimated AP value (blocks 28), or the neutral value (blocks 28).

Figure 3:
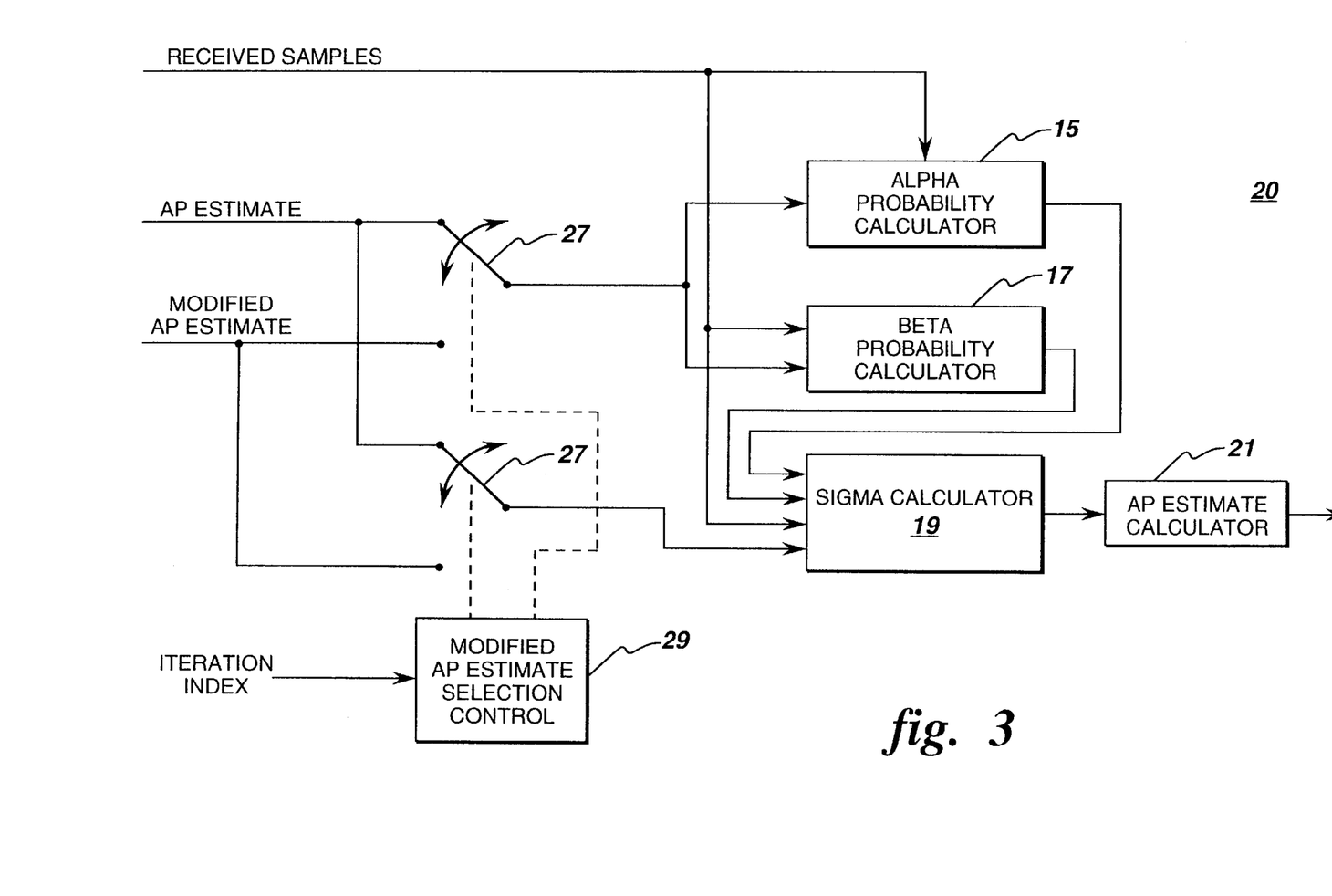
FIG. 3 is a block diagram of the bit probability estimator of FIG. 2.

FIG. 3 is a more detailed illustration of bit probability estimator 20 of FIG. 2. As shown, bit probability estimator 20 comprises an alpha probability calculator 15, a beta probability calculator 17, a sigma calculator 19, and an AP estimate calculator 21 for calculating the respective terms in accordance with the equations set forth hereinabove. In addition, FIG. 3 clearly illustrates how feedback control switches 27 in accordance with preferred embodiments of the present invention choose between the AP estimate from bit probability estimator 20 (FIG. 2) or the modified AP estimate from block 28. The AP estimates used in the alpha and beta probability calculators are selected independently by feedback control 29 from the AP estimates utilized in the sigma calculator, as shown in FIG. 3.

In one preferred embodiment, full a priori information is used for all alpha and beta calculations, and neutral a priori values are switched in for all sigma calculations, except for the final iteration for which the feedback control switch is switched back to full a priori information.

Feedback is reduced most significantly when neutral values are inserted. A compromise between full feedback and the neutral value is provided by a modified AP value. A simple modified estimate calculation useful in the linear MAP algorithm is as follows:

$$AP_{mod} = \frac{AP + 0.5}{2}. \quad (35)$$

Figure 4:
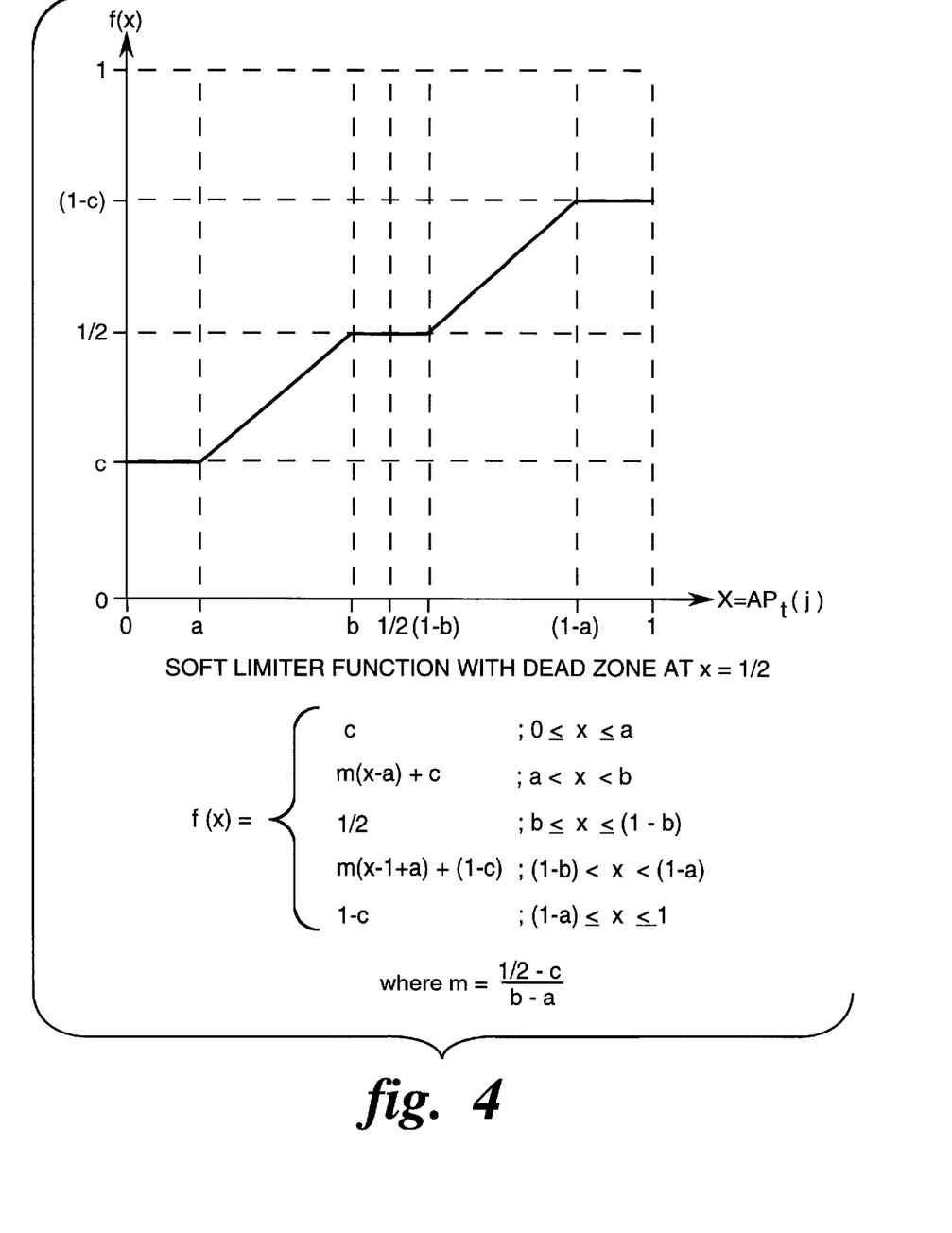
FIG. 4 graphically illustrates a soft limiter with a dead zone at $x=\frac{1}{2}$.
Figure 5:
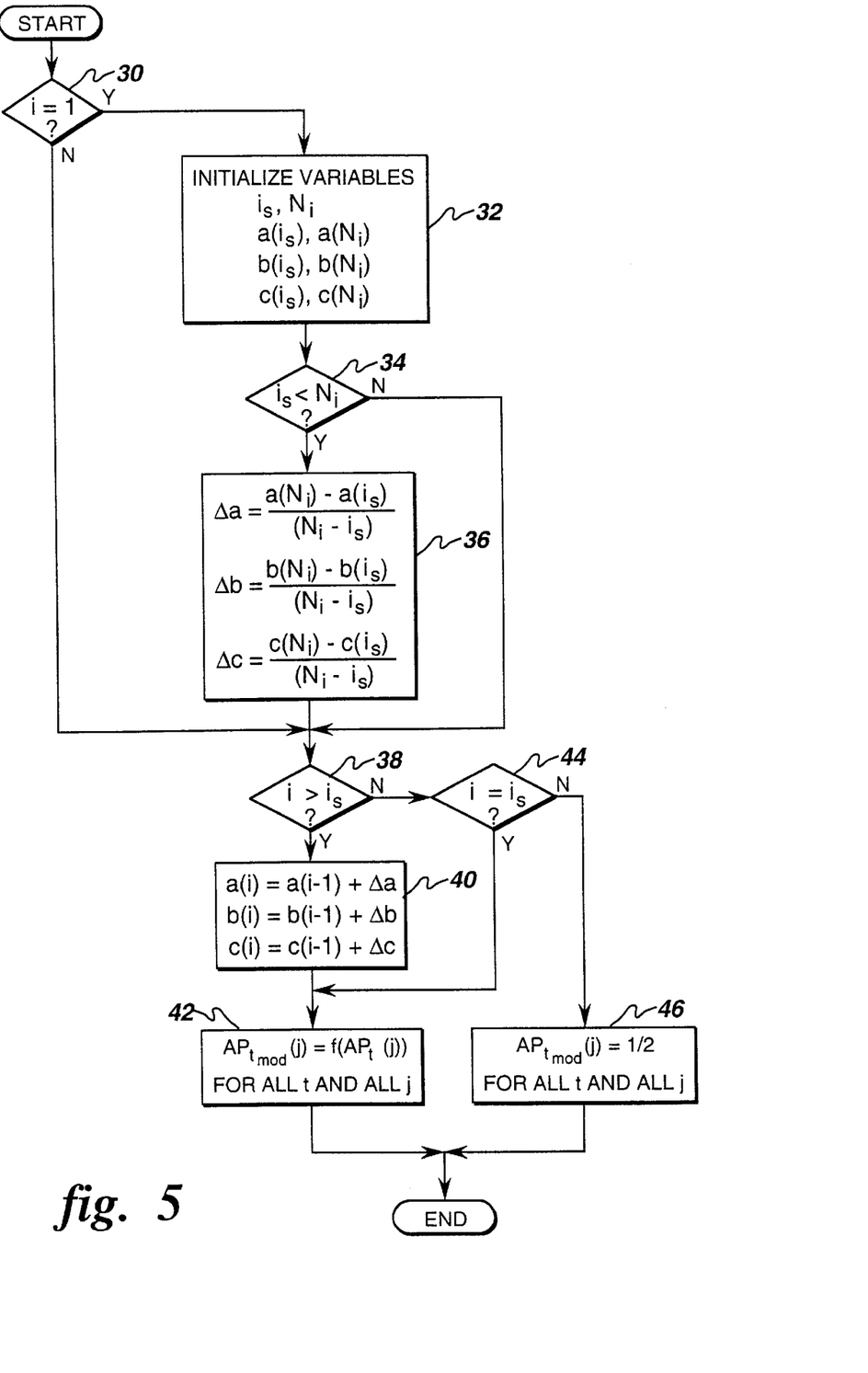
FIG. 5 is a flow chart illustrating modification of a priori probabilities as a function of iteration index in accordance with preferred embodiments of the present invention.

Another modified a priori probability estimate useful in either the linear MAP algorithm or the log-MAP algorithm is calculated as a function of the decoding iteration count, as illustrated in the flow chart of FIG. 5. The variables for this procedure are set forth as follows: i represents the iteration count; $N_i$ represents the number of decoding iterations to be used; and $i_s$ represents the starting iteration index for using a function of a posteriori bit probabilities as a priori bit (or state transition) probabilities. Then, for iteration indices $i_s$, $i_s+1, \ldots, N_i, AP_{mod}=f(AP,i)$. An exemplary type of modified a priori probability calculation is represented graphically in FIG. 4 as a modified soft limiter function $f$. In particular, the soft limiter function $f$ has been modified to allow a dead zone in the vicinity of AP=0.5 when b, a parameter of the function $f$, is not equal to 0.5. In accordance with preferred embodiments of the present invention, parameters a, b and c of the function $f$ are functions of the iteration index in order to allow more (or, alternatively, less) feedback between component decoders as decoding proceeds.

The flow chart of FIG. 5 illustrates how the parameters, and hence the function $f$, change with iteration index. Specifically, the process illustrated in FIG. 5 represents one preferred embodiment of the Modified AP Estimate block 28 of FIG. 2. The parameter update and a priori estimate modification process are summarized in the description that follows.

In decision block 30, a test is made to determine whether it is the first iteration, i.e., whether i=1. If so, the variables $i_s$ $N_i$, $a(i_s)$, $a(N_i)$, $b(i_s)$, $b(N_i)$, $c(i_s)$, and $c(N_i)$ are initialized in block 32. In block 34, a decision is made as to whether the starting iteration index (for function parameter updates) is less than the number of decoding iterations. If so, then $\Delta a$, $\Delta b$, and $\Delta c$ are calculated in block 36 as follows:

$$\Delta a = \frac{a(N_i) - a(i_s)}{N_i - i_s} \tag{36}$$

$$\Delta b = \frac{b(N_i) - b(i_s)}{N_i - i_s} \tag{37}$$

$$\Delta c = \frac{c(N_i) - c(i_s)}{N_i - i_s} \tag{38}$$

If $i > i_s$, as determined in block 38, then the parameters a, b and c are updated in block 40 before the modified a priori probabilities are calculated in block 42. If $i = i_s$, as determined in block 44, then the process bypasses block 40 and proceeds directly to block 42. If $i < i_s$, then $AP_t(j)$ is set equal to ½ or another neutral value, which is suitable for the application of interest, in block 46 for all t and all j.

In one preferred embodiment, full a priori information is used for all alpha and beta calculations, and modified a priori probability values, calculated as a function of the iteration count, are switched in for all sigma calculations, except for the final iteration for which the feedback control switch is switched back to full a priori information.

Other alternative embodiments include utilization of weighted averages of the a priori estimates obtained from previous decoding iterations, thus allowing partial a priori information in the sigma calculations.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for decoding turbo codes, comprising:
   iteratively calculating forward and backward state probabilities and a posteriori state transition probabilities for component code words of turbo codes according to a MAP decoding process;
   feeding back the a posteriori state transition probabilities as a priori state transition probabilities for use in decoding other component code words comprising the turbo code words, the initial a priori state transition probability comprising a predetermined value, each subsequent a priori state transition probability being based on previous a posteriori probability estimates.

2. The method of claim 1 wherein the subsequent a priori state transition probability estimates comprise either the latest available a posteriori probability estimates, modified a posteriori probability estimates, or neutral values, or a combination thereof.

3. The method of claim 1, further comprising the step of utilizing an iteration index and providing modified a posteriori estimates as a function of the iteration index.

4. The method of claim 1 wherein the modified a posteriori probability estimates ($AP_{mod}$) are calculated from the a posteriori estimates (AP) as follows:

$$AP_{mod} = \frac{AP + 0.5}{2}.$$

5. The method of claim 1 wherein the modified a posteriori probability estimates are calculated using a modified soft limiter function.

6. The method of claim 1 wherein the MAP decoding process comprises a logarithmic MAP decoding process.

7. The method of claim 1, comprising utilizing the a posteriori state transition probabilities as the a priori state transition probabilities for the previous decoding iteration for all forward and backward state probability calculations, and switching in neutral values for calculating modified symbol transition probabilities, which are used in all a posteriori transition probability calculations, except for the final iteration wherein the method comprises switching back in the a posteriori state transition probability from the previous decoding iteration as the a priori information for all terms comprising the final a posteriori transition probability calculation.

8. The method of claim 1 wherein the forward and backward state probabilities and the a posteriori state transition probabilities for the component code words are independently controlled.

9. A decoder for decoding turbo codes, comprising:
   a state transition probability calculator for iteratively calculating forward and backward state probabilities and a posteriori state transition probabilities for component code words of turbo codes according to a MAP decoding process;
   a feedback control for feeding back the a posteriori state transition probabilities as a priori state transition probabilities for use in decoding other component code words comprising the turbo code words, the initial a priori state transition probability comprising a predetermined value, each subsequent a priori state transition probability being based on previous a posteriori probability estimates.

10. The decoder of claim 9 wherein the feedback control provides subsequent a priori state transition probability estimates as either the latest available a posteriori probability estimates, modified a posteriori probability estimates, or neutral values, or a combination thereof.

11. The decoder of claim 9, further comprising an iteration index counter, the feedback control providing modified a posteriori estimates as a function of an iteration index.

12. The decoder of claim 9 wherein the state transition probability calculator calculates the modified a posteriori probability estimates ($AP_{mod}$) from the a posteriori estimates (AP) as follows:

$$AP_{mod} = \frac{AP + 0.5}{2}.$$

13. The decoder of claim 9 wherein the state transition probability calculator further comprises a modified soft limiter for calculating the modified a posteriori probability estimates.

14. The decoder of claim 9 wherein the MAP decoding process comprises a logarithmic MAP decoding process.

15. The decoder of claim 9 wherein the state transition probability calculator utilizes the a posteriori state transition probabilities as the a priori state transition probabilities calculated in the previous decoding iteration for all forward and backward state probability calculations, and further comprises switch means for switching in neutral values for calculating modified symbol transition probabilities, which are used in all a posteriori transition probability calculations, except for the final iteration wherein the switch means switches back in the a posteriori state transition probability from the previous decoding iteration as the a priori information for all terms comprising the final a posteriori transition probability calculation.

16. The decoder of claim 9 wherein the forward and backward state probabilities and the a posteriori state transition probabilities for the component code words are independently controlled.

17. A method for decoding turbo codes, comprising:

iteratively calculating forward and backward state probabilities and a posteriori state transition probabilities for component code words of turbo codes according to a MAP decoding process;

feeding back the a posteriori state transition probabilities as a priori state transition probabilities for use in decoding other component code words comprising the turbo code words, including providing a predetermined value as the initial a priori state transition probability, and including selecting as subsequent a priori state transition probability estimates either the latest available a posteriori probability estimates, modified a posteriori probability estimates, or neutral values, or combinations thereof;

independently controlling the forward and backward state probabilities and the a posteriori state transition probabilities for the component code words of the turbo codes.

* * * * *